(12) United States Patent
Wineland

(10) Patent No.: US 10,312,907 B2
(45) Date of Patent: Jun. 4, 2019

(54) SENSING DEVICE WITH MAGNET FOR EXTENDED SENSING DISTANCE

(71) Applicant: Gary W. Wineland, Roaring Spring, PA (US)

(72) Inventor: Gary W. Wineland, Roaring Spring, PA (US)

(*) Notice: Subject to any disclaimer, the term of this patent is extended or adjusted under 35 U.S.C. 154(b) by 0 days.

(21) Appl. No.: 15/171,644

(22) Filed: Jun. 2, 2016

(65) Prior Publication Data

US 2017/0331473 A1   Nov. 16, 2017

Related U.S. Application Data

(60) Provisional application No. 62/230,504, filed on Jun. 8, 2015.

(51) Int. Cl.
| | | |
|---|---|---|
| *G01B 7/00* | (2006.01) | |
| *G01B 7/02* | (2006.01) | |
| *G01D 5/20* | (2006.01) | |
| *H03K 17/95* | (2006.01) | |

(52) U.S. Cl.
CPC ......... *H03K 17/9502* (2013.01); *G01B 7/003* (2013.01); *G01B 7/023* (2013.01); *G01D 5/2006* (2013.01); *H03K 17/952* (2013.01); *H03K 17/9505* (2013.01); *H03K 17/9525* (2013.01)

(58) Field of Classification Search
CPC ............. H03K 17/9502; H03K 17/952; H03K 17/9505; G01B 7/023; G01B 7/003; G01D 5/2006
See application file for complete search history.

(56) References Cited

U.S. PATENT DOCUMENTS

| | | | | | |
|---|---|---|---|---|---|
| 4,618,823 | A | * | 10/1986 | Dahlheimer | H03K 17/9505 324/207.16 |
| 4,647,892 | A | * | 3/1987 | Hewitt | G01P 1/026 310/155 |
| 4,841,243 | A | * | 6/1989 | Bishop | G01P 3/488 324/173 |
| 4,947,035 | A | * | 8/1990 | Zook | G01D 5/344 250/225 |
| 4,967,154 | A | * | 10/1990 | Marantette | G01B 7/14 324/207.12 |
| 5,239,130 | A | * | 8/1993 | Brasse | H03K 17/945 174/542 |
| 5,264,792 | A | * | 11/1993 | Luetzow | G01B 7/023 324/174 |
| 5,926,018 | A | * | 7/1999 | Jones | G01D 5/145 324/207.22 |
| 6,882,143 | B2 | * | 4/2005 | Clymer | G01D 5/2013 324/174 |
| 6,903,544 | B2 | * | 6/2005 | Kurz | G01D 5/485 324/207.13 |

(Continued)

*Primary Examiner* — Jermele M Hollington
*Assistant Examiner* — Sean Curtis
(74) *Attorney, Agent, or Firm* — Fox Rothschild LLP

(57) ABSTRACT

A device that will increase an inductive proximity sensor's detection distance and detection position is disclosed. The device uses a housing in combination with a sensor and axially magnetized magnet and a target magnet to achieve the increased detection distance and position. The device can be defined as universal because it allows different manufacturers and sizes of sensors to be used and calibrated. An optional threaded end section of the device allows connection of standard conduit fittings.

19 Claims, 4 Drawing Sheets

(56) References Cited

U.S. PATENT DOCUMENTS

| | | | | |
|---|---|---|---|---|
| 7,071,680 B2 * | 7/2006 | Kurz | ................ | G01D 5/485 |
| | | | | 324/207.13 |
| 7,285,950 B2 * | 10/2007 | Jagiella | ............. | F15B 15/2892 |
| | | | | 324/207.15 |
| 7,411,385 B2 * | 8/2008 | Kirchdoerffer | .... | H03K 17/9505 |
| | | | | 324/207.15 |
| 7,489,217 B2 * | 2/2009 | Rohrig, III. | ......... | H01H 36/002 |
| | | | | 324/207.26 |
| 8,384,376 B2 * | 2/2013 | Steinich | ............... | G01D 5/145 |
| | | | | 324/174 |
| 2003/0222744 A1 * | 12/2003 | Clymer | ............... | G01D 5/2013 |
| | | | | 336/110 |
| 2008/0068160 A1 * | 3/2008 | Frazier | ................... | B61B 12/06 |
| | | | | 340/540 |
| 2009/0001972 A1 * | 1/2009 | Fernandez | ........ | G01D 5/24452 |
| | | | | 324/207.26 |
| 2010/0013466 A1 * | 1/2010 | Steinich | ................... | G01B 7/30 |
| | | | | 324/207.25 |
| 2014/0002061 A1 * | 1/2014 | Giroud | .................. | G01B 7/023 |
| | | | | 324/202 |
| 2017/0331473 A1 * | 11/2017 | Wineland | .......... | H03K 17/9502 |

\* cited by examiner

SENSING DEVICE WITH MAGNET FOR EXTENDED SENSING DISTANCE

CROSS-REFERENCE TO RELATED APPLICATIONS

This utility patent application claims priority to U.S. Provisional Patent Application No. 62/230,504 filed Jun. 8, 2015.

STATEMENT REGARDING FEDERALLY SPONSORED RESEARCH OR DEVELOPMENT (not applicable)

NAMES OF PARTIES TO A JOINT RESEARCH AGREEMENT (not applicable)

INCORPORATION-BY-REFERENCE OF MATERIAL SUBMITTED (not applicable)

STATEMENT REGARDING PRIOR DISCLOSURES BY THE INVENTOR OR A JOINT INVENTOR (not applicable)

BACKGROUND

Inductive proximity sensors have been used for many applications requiring motion detection. Proximity sensors come in various shapes and sizes. Some are tubular while others rectangle and pancake style. It is to be noted that the foregoing sensor applications are tubular in design. These sensors, when a metal object is passed over their sensing face, will turn on or off, depending on the configuration of the sensor. The configuration of the sensor can be a normally open or normally closed. An example would be that if voltage is applied to a normally open sensor and there is not a metal target over the face then the output of the sensor would be zero. Accordingly, when metal is passed over the face, the output would be the same as the voltage it is being powered with. Further, a normally closed sensor output would be the same as its input with no metal at the face and zero when metal is passed over the face. Most of industry relies on these proximity sensors to detect motion on equipment. Some of this equipment has rotating shafts, gates that open and close and many other examples. The end result from using sensors is to provide either signal (as in the case of a normally closed or normally open sensor configuration) that can be sent to a computer, indicator light, alarm or many other devices that can show if equipment being monitored is preforming correctly.

The proximity sensor needs a metal target passed over the sensing face to become active. There are many ways to install sensors and to install metal targets for the sensor to detect. On rotating shafts of equipment, metal targets have been welded or attached with threaded holes. On non-rotating equipment, such as a two part gate, steel has been welded on one half of the gate and the sensor mounted on the other so as the gate closed, the sensor would detect the welded steel target. Further, as the gate opened and the two half's of the clam opened, the sensor would lose presence of the welded target and lose detection. In any case, the above examples are just a representative of possible ways target metal and sensors can be mounted. It is just an example which are used but not deemed the only way to mount such devices and how they are used to detect movement of an apparatus.

Proximity sensors have to be mounted and positioned according to their detection distance and position. Whereas, if a sensor had a sensing distance of 0.125 inches, it has to be mounted within 0.125 inches from the metal target to operate correctly. Also, the sensor sensing face has to be in line with the target. On a tubular sensor, the face is at one end of the tubular configuration. Obviously, if the target metal exceeds the maximum detection distance, the proximity sensor will not detect the target and thus not operate. End users of these sensors are limited in how they and the target metal are mounted. The manufacturers of sensors provide many accessories that secure the sensors when mounted so as to secure any movement of the sensor. They also provide target metal which also has to be secured. In any case, it is still the end user's responsibility to mount both the sensor and the target within the parameters of sensing distance. The mounting varies according to the characteristics of the apparatus that is being monitored for movement. One example would be a rotating shaft. The target would have to be attached to the shaft and the sensor mounted nearby within the detection range. A simple explanation of this process can be explained by using a common door that opens and closes. If the sensor is mounted on the door frame and the target mounted on the door it should be obvious that when the door is closed the sensor detect the target and turns on. When the door is opened the sensor loses detection of target and turns off. In any case, the detection distance must be obtained for proper operation.

End users of proximity sensors are limited in mounting possibilities because of the small detection distance. In simpler examples such as a door, it would not be too difficult to stay within the detection distance parameters. In other cases, such as a rotating shaft on equipment, the mounting becomes more difficult. The majority of sensor use in industry is such that difficulties arise when trying to mount sensor and target. Staying within the confines of the sensor detection distance is something that the end user has to accomplish. Also, as noted before, the target has to pass over the sensor's sensing face within the detection distance to activate the sensor.

To better understand how the sensor operates, we will use an example, such as a common lead pencil. The pencil resembles an inductive proximity sensor because it is tubular in design and has an eraser on one end which also resembles the sensing face of sensors. With that in mind, if a metal target is passed close to the eraser face, it becomes active or turns on. If the target passes perpendicularly or longitudinally over the body of the pencil but not coming within the detection distance of the eraser or face, it will not turn on. The target metal also must be within the detection distance of the face or, as in the example, eraser before sensor turns on.

SUMMARY

This invention relates generally to the field of motion detection with the use of both shielded and un-shielded inductive proximity sensors that are two or three wire design in either AC or DC voltages and more particularly to providing a means of eliminating the problem associated with the limited sensor detection distance. It should be noted that this invention is related to only inductive proximity sensors that are either shielded or un-shielded. There are other proximity sensors that are not inductive. Any reference in this application to proximity sensors pertains only to inductive proximity sensors.

A more technical explanation of the components that an inductive proximity sensor comprises is as follows. The present application provides this only for reference to better understand operation of inductive proximity sensors and applicant does not admit this as prior art.

An inductive proximity sensor has four components: the coil, oscillator, detection circuit, and output circuit. The target material, environment, and mounting restrictions all have an influence on these items and on the sensor's operation, magnetic nature, and shielding. The oscillator generates a fluctuating, doughnut-shaped magnetic field around the winding of the coil, which is located in the device's sensing face. When a metal object moves into the sensor's field of detection, Eddy currents build up in the object, magnetically push back, and finally dampen the sensor's own oscillation field. The sensor's detection circuit monitors the amplitude of the oscillation and, when it becomes sufficiently damped, triggers the output circuitry. Inductive proximity sensors are designed to operate by generating an electromagnetic field and detecting the eddy current losses generated when ferrous and nonferrous metal target objects enter the field. Further, the sensor consists of a coil on a ferrite core, an oscillator, a trigger-signal level detector and an output circuit. As a metal object advances into the field, eddy currents are induced in the target. The result is a loss of energy and a smaller amplitude of oscillation. The detector circuit then recognizes a specific change in amplitude and generates a signal which will turn the solid-state output "ON" or "OFF".

As was previously noted, the proximity sensors that are used with the current invention are of either two or three wire design. In describing two wire sensors, it is necessary to also describe three wire sensors. First, two wire sensors incorporate one wire as power or feed and another as the signal. The signal has to be connected to a proper device such as a relay, computer or other indicating device for the sensor to operate. The reason for this is that the sensor needs to be connected to a device such as described to complete the circuit because all power needs a path to neutral or ground to become active. To further describe this we can use the example of a normal 110 v AC household appliance. A common receptacle has 3 slots for a cord to plug into. The third round slot is for ground but in the following example it is not discussed. One slot is high value, sometimes referred to as "hot" or "feed", and the other slot is neutral or the path to complete the circuit. Therefore, if only one prong of an appliance power cord was inserted into the receptacle the appliance would not work because the path would not exist. Three wire sensors incorporate one wire for "feed", one wire for neutral or "return" and one wire as the signal. The importance of offering this two wire capability is that many end users already have two wire proximity sensors installed and a two wire proximity sensor replacement eliminates the end user to install another wire as needed in a three wire proximity sensor. The present invention provides the end user the option to use a two wire inductive proximity sensor and also increase its detection distance and position.

DETAILED DESCRIPTION

Figure 1:
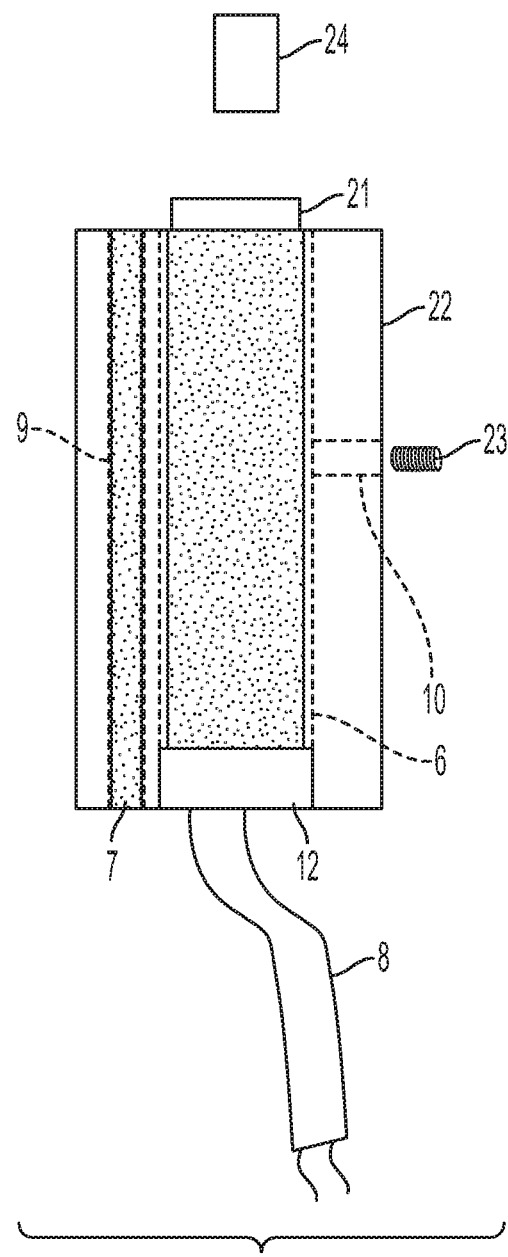
FIG. 1 is a side and upright view of the device that shows all the elements combined that are needed to create the current invention.

A detailed description of the present invention are provided herein. It is to be understood, however, that the present invention may be embodied in various forms. Therefore, specific details disclosed herein are not to be interpreted as limiting, but rather as a basis for the claims as a representative basis for teaching one skilled in the art to employ the present invention in virtually any appropriate detailed system, structure or manner.

The sensors used in the following description are tubular in design. Their diameter are industry standard of 8, 12, 18 and 30 mm in diameter. Their length varies. This length is not an industry standard but can be assumed to be anywhere from 1 to 4 inches. The sensing distance varies but it can be assumed that an 8 mm sensor has a much less detection distance than a 30 mm sensor. Further, these distances are usually in the order of 0.125 to 1 inch. These detection distances are based on steel as the target. Other target material such as brass, copper, aluminum, etc. decrease the sensing distance. There are other proximity sensors that have non-tubular designs which operate similarly.

A more technical explanation of the components that an inductive proximity sensor comprises is as follows. The present application provides this only for reference to better understand operation of inductive proximity sensors and applicant does not admit this as prior art.

An inductive proximity sensor has four components: the coil, oscillator, detection circuit, and output circuit. The target material, environment, and mounting restrictions all have an influence on these items and on the sensor's operation, magnetic nature, and shielding. The oscillator generates a fluctuating, doughnut-shaped magnetic field around the winding of the coil, which is located in the device's sensing face. When a metal object moves into the sensor's field of detection, Eddy currents build up in the object, magnetically push back, and finally dampen the sensor's own oscillation field. The sensor's detection circuit monitors the amplitude of the oscillation and, when it becomes sufficiently damped, triggers the output circuitry. Inductive proximity sensors are designed to operate by generating an electromagnetic field and detecting the eddy current losses generated when ferrous and nonferrous metal target objects enter the field. Further, the sensor consists of a coil on a ferrite core, an oscillator, a trigger-signal level detector and an output circuit. As a metal object advances into the field, eddy currents are induced in the target. The result is a loss of energy and a smaller amplitude of oscillation. The detector circuit then recognizes a specific change in amplitude and generates a signal which will turn the solid-state output "ON" or "OFF".

As was previously noted, the proximity sensors that are used with the current invention are of either two or three wire design. In describing two wire sensors, it is necessary to also describe three wire sensors. First, two wire sensors incorporate one wire as power or feed and another as the signal. The signal has to be connected to a proper device such as a relay, computer or other indicating device for the sensor to operate. The reason for this is that the sensor needs to be connected to a device such as described to complete the circuit because all power needs a path to neutral or ground to become active. To further describe this we can use the example of a normal 110 v AC household appliance. A common receptacle has 3 slots for a cord to plug into. The third round slot is for ground but in the following example it is not discussed. One slot is high value, sometimes referred to as "hot" or "feed", and the other slot is neutral or the path to complete the circuit. Therefore, if only one prong of an appliance power cord was inserted into the receptacle the appliance would not work because the path would not exist. Three wire sensors incorporate one wire for "feed", one wire for neutral or "return" and one wire as the signal. The importance of offering this two wire capability is that many end users already have two wire proximity sensors installed and a two wire proximity sensor replacement eliminates the end user to install another wire as needed in a three wire proximity sensor. The present invention provides the end user the option to use a two wire inductive proximity sensor and also increase its detection distance and position.

Referring to FIG. 1, the present invention will be described. Housing 22 can be seen to hold all items that when assembled make-up the complete apparatus. It is a machined non-metallic material such as plastic, nylon, fiberglass or any other non-metallic material. Housing 22 is shown on FIG. 2, which is a top view of FIG. 1. Hole 6 is a threaded bore for sensor 21. Hole 12 is a machined thread size of ½ inch NPT. This thread is slightly larger than 6 and allows the current invention to be connected to a standard conduit connector. In the assembly process of the current invention, sensor 21 is threaded into hole 6 and because threaded hole 12 is a larger hole, sensor 21 is inserted past threaded hole 12 until it meets the threads in hole 6. Hole 6 is machined with threads to match sensor 21. Sensor 21 then is threaded into housing 2 and positioned correctly. It is important to note that different manufacturers of sensors will be positioned at different locations within housing 21. Therefore, by turning the sensor in the threads, the correct position can be attained. When assembling a complete apparatus, all items are within or about the housing 2 except for target 24. FIG. 1 also shows sensor 21 can detect the presence of target 24 at its face end. Cable 8 is connected to a pilot light for visual indication. Target 24, which may be a magnet or a metallic object, is positioned at approximately 3 to 4 inches from the face of sensor 21. Sensor 21 is then adjusted within hole 6 in housing 22 until the pilot light turns on. Then, target 24 is removed to assure the pilot light turns off. Target 24 is then moved back to the original position. If the pilot light comes on, the process of positioning is complete and set screw 23 is tightened to prevent sensor 21 to move, thus assuring the assembled current invention is calibrated. The 3 to 4 inch distance referred to is just an average distance. Some sensors may meet and exceed this distance while others may not. Therefore, the 3 to 4 inch distance referred to cannot be an exact distance, although in most cases, it can be an average.

Turning now to hole 10 on FIG. 1, the threaded bore is machined for the thread size of set screw 23. Hole 10 is machined completely through the body of housing 22 and into the bore of hole 6. Therefore, when sensor 21 is inserted into housing 22 and calibrated, and set screw 23 is threaded into hole 10, set screw 23 will come in contact with sensor 21 and lock sensor 21 in place within housing 22. Hole 10 can only be a threaded bore and set screw 23 can only be a screw with machined threads. The thread size hole 10 depends only on the thread size of set screw 23. As was mentioned previously, sensor 21 can have different diameters and different thread sizes. Further, since the present invention will operate correctly with various diameters of inductive proximity sensors, hole 6 will be machined for these different diameters of sensor 21.

In FIG. 1, hole 9 is shown as a hole completely through the length of housing 22. This is a straight hole without threads. The purpose of this hole is so that magnet 7 can be press fit into hole 9. The diameter of the hole 9 is slightly smaller than magnet 7. The purpose of drilling hole 9 smaller than magnet 7 is to create a press fit for magnet 7. In the process of assembling, magnet 7 is pressed into hole 9 throughout the length of housing 22.

Further on FIG. 1, target 24 is shown as the target magnet. Target 4 is an axially magnetized magnet. Target 24 is not included within the assembled apparatus but rather a separate entity that is to be placed on the member of equipment that is being monitored for motion detection. Target 24 is needed for the invention operation and not connected internally to housing 22. To further clarify it should be obvious that housing 22 in its completed form contains sensor 21, set screw 23, and magnet 7. Also, housing 22 needs to be machined for these items. Therefore, holes 6, 10 and 9 are the machined bores either with machined threads or straight bore. Cable 8 is only the cable from sensor 21.

In reference to target 24, it can be seen in FIG. 1 to be positioned at the face or detection area of sensor 21. It should be noted that the current invention uses an target 4 that is ⅞" in diameter by 1" long axially magnetized magnet. Thus, in the foregoing examples of detection distance, it is to be understood that any reference to detecting distances are based on target 24 having these dimensions. The target 24 dimensions are being used for reference to show how the current invention creates a longer detection distance. The current invention can use different sizes of target 24 to accommodate different applications for the end user and will effect detection distance.

In this example seen on FIG. 1, sensor 21 would detect target 24 and "turn on" or become active. The distance between target magnet target 24 and sensor 21 face is referred to as "detection distance". If a standard inductive proximity sensor without the current invention was used, this distance would be a nominal distance as per the specifications of the sensor. As stated earlier, this distance is in the range of 0.125 to 1 inch. With the standard inductive proximity sensor incorporated within the current invention, this distance is increased to approximately 3.5 inches based on the size of target 24. Because target 24 may vary in size to the application of the end user, the current invention's detection distance can vary but in any case, it greatly increases detection distance over a standard inductive proximity sensor used without the current invention.

Figure 3:
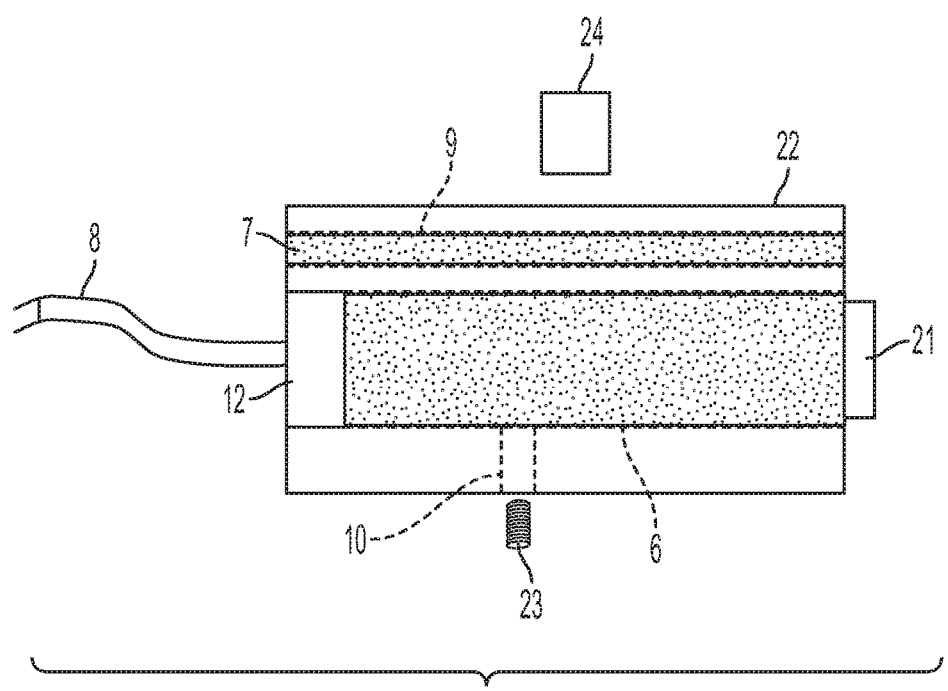
FIG. 3 is a side and horizontal view that is identical to FIG. 1 except that 4 the target is positioned laterally unlike FIG. 1.
Figure 4:
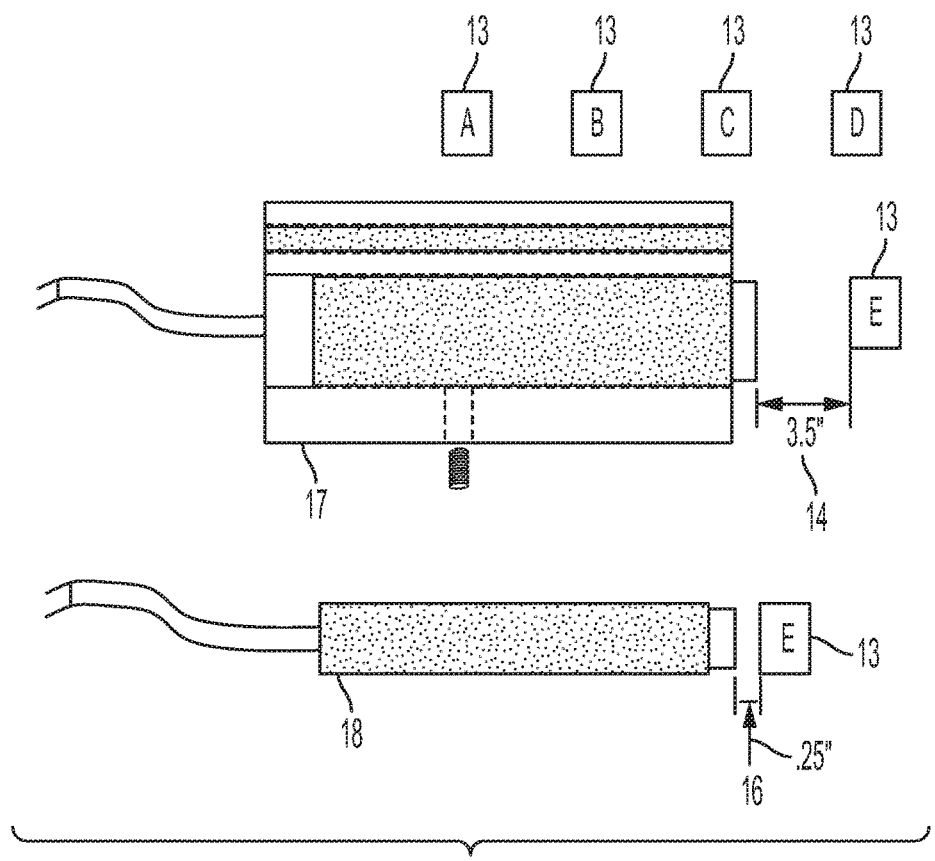
FIG. 4 illustrates sensing distance differences between the current invention and a prior art-type inductive proximity sensor alone.

In FIG. 3 we can see target 24 is now positioned on the side of the current invention and not at the face as was seen in FIG. 1. FIG. 3 shows that the device will operate even though the target 24 is not positioned at the face end of element. As long as the distance is within the approximately 3.5 inches, the proximity sensor incorporated within the current invention will become active or "turn on". Also, it should be understood that sensor 21 will become active as long as target 24, being within the detection distance, is placed other than at the face of sensor 21. FIG. 4 shows different locations of the target. The blocks A, B, C, D and E represent various positions for the target. Sensor will become active if target is placed anywhere between Blocks A thru E within the detection distance. This is especially helpful in applications that do not permit direct alignment between the target and the face of the sensor. It should be understood that FIG. 4 is only a representative showing multiple points that the target can activate the sensor.

Figure 2:
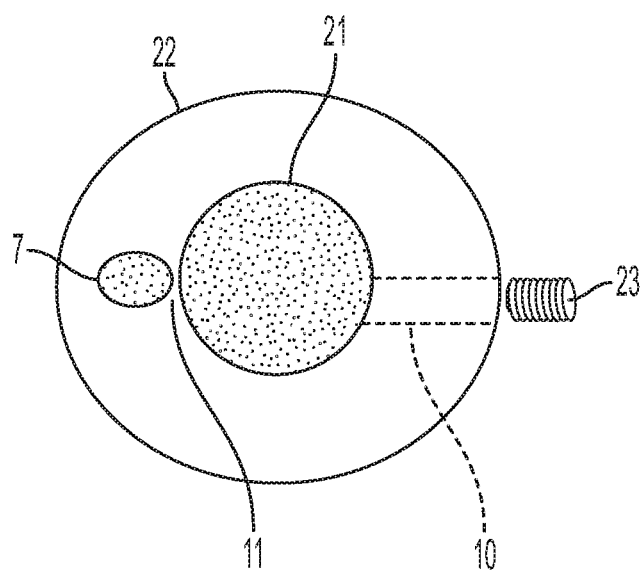
FIG. 2 is a top view of the device in combination but not showing the target as in FIG. 1.

In FIG. 2, which is an end view, dimension 11 shows the distance between hole 6 and hole 9, which in the example shown is a minimal clearance. As discussed previously, hole 6 is a threaded bore. Therefore, hole 9 straight bore may be as close as possible to hole 6 without interfering with the finished machined threads of hole 6. The actual placement of hole 9 cannot be defined in dimension of placement on housing 22 because of the various diameter sizes of sensor 21 that could installed. Of course, the dimension of hole 6 depends on the dimension of sensor 21. In any case, hole 9 and hole 6 may be as close as possible without interfering with each ones finished machining.

FIG. 4 will give a comparison of a common inductive proximity sensor and the current invention. Sensing device 17 is an example sensing device of the current invention fully assembled with all the components. Reference 13 depicts the target in the various positions A-B-C-D-E that the sensor can detect target presence. Also, dimension 14 shows the example detecting distance between the sensing device and the target in inches. Reference 18 shows just a normal sensor without the current invention. Reference 13 which is target E is shown in the only position where a sensor without the current invention can detect its presence. Dimension 16 shows in inches the example detecting distance. It can be seen that there is only one detection position and the distance is greatly reduced.

An object of the invention is to provide an apparatus that extends the detection distance of inductive proximity sensors.

Another object of the invention is to provide an apparatus that extends the detection distance of inductive proximity sensors of various dimensions.

Another object of the invention is to provide an apparatus that extends the detection distance of two wire inductive proximity sensors.

Another object of the invention is to provide a magnet that is used as a target for the inductive proximity sensor within the apparatus.

Another object of the invention is to provide an apparatus that increases an inductive proximity sensor's sensing area.

Another object is to provide machined threads in the housing so that different brands of sensors to be properly adjusted.

Another object of the invention is to provide an apparatus that does not limit detection to one position.

Another object of the invention is to provide an apparatus that can be connected to an industry standard conduit connector.

Another object of the invention is to provide an apparatus that can use either two or three wire inductive proximity sensors.

I claim:

1. A proximity sensing device comprising:
   a housing comprising a first hole and a second hole, wherein the housing has a longitudinal axis;
   an inductive proximity sensor contained within the first hole; and
   an axially magnetized magnet mounted within the second hole,
   wherein:
   the first hole and the second hole are parallel to each other, and parallel lengthwise along the longitudinal axis of the housing, along each hole's longitudinal axis, and
   the inductive proximity sensor and the axially magnetized magnet are also are positioned parallel to each other along each other's longitudinal axis.

2. The proximity sensing device of claim 1 wherein the housing comprises:
   a set screw that locks the sensor in place in the housing; and
   a threaded bore that contains the set screw.

3. The proximity sensing device of claim 1 further comprising:
   a pilot light.

4. The proximity sensing device of claim 1 further comprising:
   a target magnet for interaction with the inductive proximity sensor.

5. The proximity sensing device of claim 1, wherein the housing further comprises:
   a threaded hole for receiving a conduit connector.

6. The proximity sensing device of claim 1 wherein the inductive proximity sensor is a two wire inductive proximity sensor.

7. The proximity sensing device of claim 1 wherein the inductive proximity sensor is a three wire inductive proximity sensor.

8. The proximity sensing device of claim 1 wherein the inductive proximity sensor operates on AC or DC voltage.

9. The proximity sensing device of claim 1, wherein:
   the first hole is centrally located within the housing; and
   the second hole is located within a sidewall of the housing and is not centrally located within the housing.

10. The proximity sensing device of claim 2, wherein the threaded bore that contains the set screw has a longitudinal axis that is perpendicular to the longitudinal axes of the first hole and the second hole.

11. The proximity sensing device of claim 1, wherein:
   the second hole has a diameter that is smaller than a diameter of the axially magnetized magnet; and
   the axially magnetized magnet is press-fit within the second hole.

12. The proximity sensing device of claim 1, wherein:
   the first hole is a threaded bore; and
   the inductive proximity sensor includes threads that meet threads of the threaded bore.

13. The proximity sensing device of claim 1, wherein the first hole and the second hole are positioned in the housing to be close to each other without interfering with each other.

14. A proximity sensing device comprising:
   a housing comprising a first hole and a second hole;
   an inductive proximity sensor contained within the first hole, wherein the inductive proximity sensor is a two wire inductive proximity sensor; and
   an axially magnetized magnet mounted within the second hole.

15. A proximity sensing device comprising:
   a housing comprising a first hole and a second hole;
   an inductive proximity sensor contained within the first hole; and
   an axially magnetized magnet mounted within the second hole,
   wherein:
   the first hole is centrally located within the housing, and the second hole is located within a sidewall of the housing and is not centrally located within the housing.

16. A proximity sensing device comprising:
   a housing comprising a first hole and a second hole;

an inductive proximity sensor contained within the first hole; and an axially magnetized magnet mounted within the second hole, wherein:

the second hole has a diameter that is smaller than a diameter of the axially magnetized magnet, and the axially magnetized magnet is press-fit within the second hole.

17. A proximity sensing device comprising:

a housing comprising a first hole and a second hole;

an inductive proximity sensor contained within the first hole; and an axially magnetized magnet mounted within the second hole, wherein:

the first hole is a threaded bore, and the inductive proximity sensor includes threads that meet threads of the threaded bore.

18. A proximity sensing device comprising:

a housing comprising a first hole and a second hole, wherein the first hole and the second hole are positioned in the housing to be close to each other without interfering with each other;

an inductive proximity sensor contained within the first hole; and an axially magnetized magnet mounted within the second hole, wherein, during operation, the inductive proximity sensor is capable of becoming active when a target magnet is within a detection distance from the sensor, wherein the detection distance includes distances that are greater than 1 inch and that are in a range of 3 to 4 inches.

19. The proximity sensing device of claim 18, wherein the first hole, the second hole, or both the first hole and the second hole extend completely through a length of the housing.

* * * * *